United States Patent [19]
Koizumi et al.

[11] Patent Number: 5,745,583
[45] Date of Patent: Apr. 28, 1998

[54] AUDIO PLAYBACK SYSTEM

[75] Inventors: Jun Koizumi, Wako; Minoru Kobayashi, Yokohama, both of Japan

[73] Assignees: Honda Giken Kogyo Kabushiki Kaisha, Tokyo; Matsushita Electric Industrial Co, Ltd., Kadoma, both of Japan

[21] Appl. No.: 858,766

[22] Filed: May 19, 1997

Related U.S. Application Data

[63] Continuation of Ser. No. 415,379, May 25, 1995, abandoned.

[30] Foreign Application Priority Data

Apr. 4, 1994 [JP] Japan .................................. 6-087250

[51] Int. Cl.$^6$ ........................................................ H04B 1/00
[52] U.S. Cl. .................... 381/86; 381/103; 381/104; 381/107
[58] Field of Search ..................... 381/86, 98, 101–104, 381/107–109

[56] References Cited

U.S. PATENT DOCUMENTS

| | | | |
|---|---|---|---|
| 4,363,001 | 12/1982 | Suzuki et al. | 381/101 |
| 4,903,307 | 2/1990 | Ozawa et al. | 381/86 |
| 5,450,312 | 9/1995 | Lee et al. | 381/103 |

FOREIGN PATENT DOCUMENTS

| | | | |
|---|---|---|---|
| 4033407 | 11/1991 | Germany | 381/98 |
| 0279506 | 3/1990 | Japan | 381/103 |
| 0043508 | 1/1992 | Japan | 381/103 |

Primary Examiner—Curtis Kuntz
Assistant Examiner—Duc Nguyen
Attorney, Agent, or Firm—Armstrong, Westerman, Hattori, McLeland & Naughton

[57] ABSTRACT

An audio playback system wherein upon selection of a music genre there is made an automatic setting to an optimum frequency characteristic and at the same time a constant sound volume characteristic is obtained irrespective of the selected music genre. The audio playback system includes a memory which stores optimum equalizer characteristics and sound volume characteristics for plural music genre respectively, a mode setting device for setting a mode for each music genre by operation from the exterior, an equalizer characteristic selector for selecting a corresponding equalizer characteristic from the memory on the basis of the mode set by the mode setting device, and a sound volume characteristic selector for selecting a corresponding sound volume characteristic from the memory on the basis of the mode set by the mode setting device, wherein a sound is reproduced in accordance with the equalizer characteristic and sound volume characteristic selected by the equalizer characteristic selector and the sound volume characteristic selector, respectively.

6 Claims, 4 Drawing Sheets

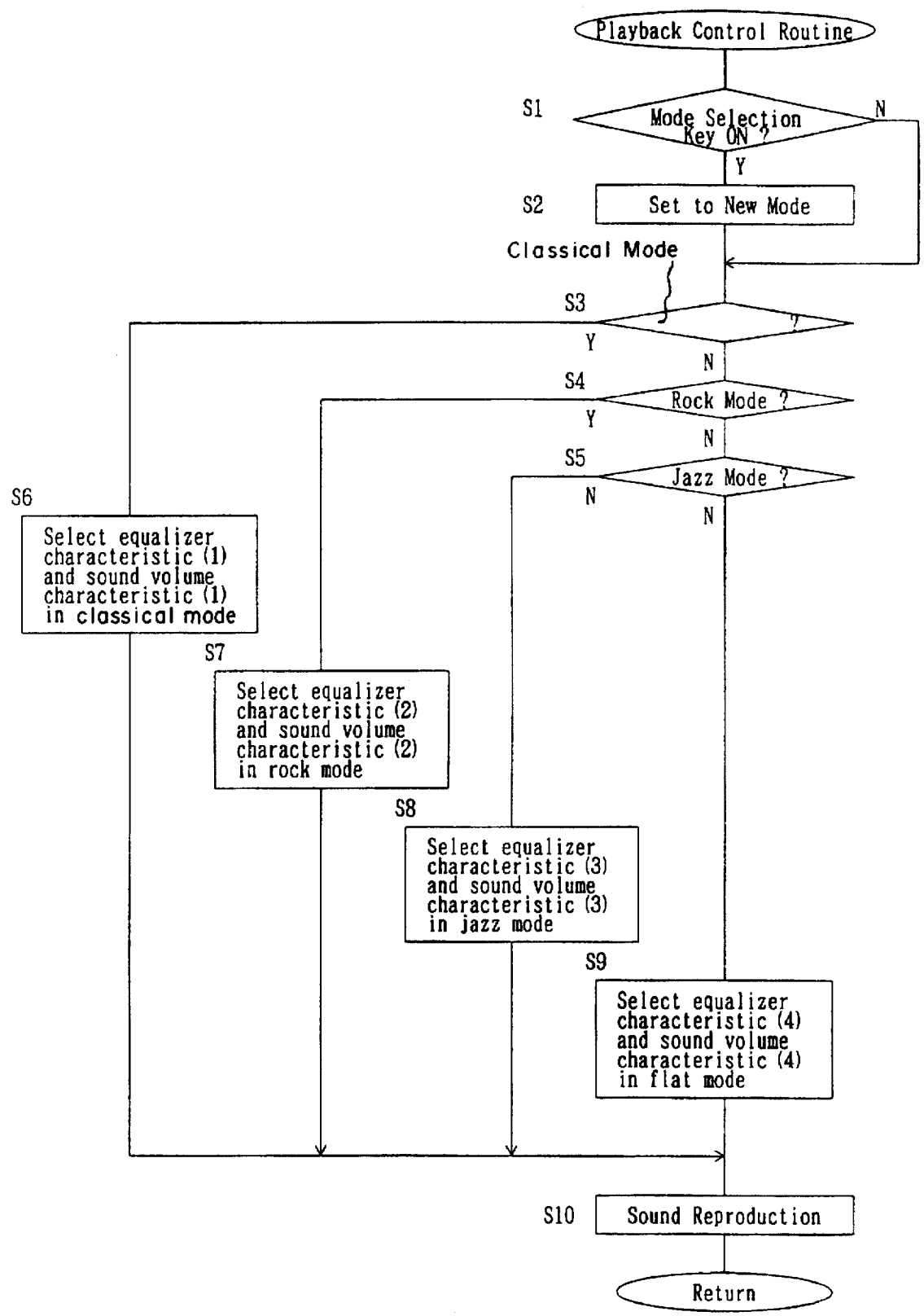
F I G . 4

AUDIO PLAYBACK SYSTEM

This application is a continuation of application Ser. No. 08/415,379, filed May 25, 1995, now abandoned.

BACKGROUND OF THE INVENTION

1. Field of the Invention

The present invention relates to a playback system for audio devices such as an AM receiver, an FM receiver, a tape deck and a CD player.

2. Description of the Related Art

In order to reproduce a sound field effectively it is necessary to adjust its frequency characteristic according to music genres, including classical, rock and jazz.

For example, in the case of classical music, a flat characteristic over a wide frequency range is required because a wide variety of musical instruments are used; in the case of rock music, a low frequency-emphasized characteristic is required; and in the case of jazz, a low and high frequency-emphasized characteristic is required.

Heretofore, in view of the above requirements, there has been known a method wherein equalizer characteristics for realizing frequency characteristics which are considered best suited for various music genres respectively are provided in advance, and when a music genre is selected by a listener's operation, an equalizer characteristic corresponding to the music genre thus set is selected to permit the reproduction of sound at an optimal frequency characteristic.

Even if a frequency characteristic suitable for each music genre can be realized, sound pressure changes reproduced in the interior of a room do not exhibit a constant characteristic because the energy spectrum is different from one music genre to another. Therefore, when the listener intends to always hear music at a constant sound volume, it is necessary for the listener to adjust the sound volume for each music genre, but this is very troublesome.

Particularly in the case of an audio playback system for use in a vehicle and when the driver adjusts the sound volume for each music genre while driving the vehicle, this operation must be repeated a number of times resulting in a greater trouble than in the case of an audio playback system for use in the interior of a room.

SUMMARY OF THE INVENTION

The present invention has been accomplished in view of the above points and it is one object of the invention to provide an audio playback system which permits automatic setting of both optimum frequency characteristic and optimum sound volume characteristic upon selection of a music genre.

According to the present invention, in order to achieve the above-mentioned object, there is provided an audio playback system including a memory means which stores optimum equalizer characteristics and sound volume characteristics for various music genres respectively, a mode setting means for setting a mode for each music genre by exterior operation, an equalizer characteristic selecting means for selecting a corresponding equalizer characteristic from the memory means on the basis of the mode set by the mode setting means, and a sound volume characteristic selecting means for selecting a corresponding sound volume characteristic from the memory means on the basis of the mode set by the mode setting means, wherein a sound is reproduced in accordance with the equalizer characteristic selected by the equalizer characteristic selecting means and the sound volume characteristic selected by the sound volume characteristic selecting means.

Once a mode for a desired music genre is set, both equalizer characteristic and sound volume characteristic suitable for the set music genre are selected from among a plurality of pre-stored equalizer characteristics and sound volume characteristics and a sound is reproduced in accordance with the selected characteristics, so that not only the frequency characteristic but also the sound volume is automatically adjusted continually to a constant optimum level, thus eliminating the need of the troublesome sound volume adjustment for each music genre. This is convenient, particularly in the case of an audio playback system for use in a vehicle.

BRIEF DESCRIPTION OF THE DRAWINGS

FIG. 4 is a flowchart showing a control procedure using a microcomputer 11 in the embodiment.

DETAILED DESCRIPTION OF THE PREFERRED EMBODIMENT

The embodiment of the present invention illustrated in FIGS. 1 to 4 will be described in detail below.

The audio playback system according to this embodiment, indicated at 1, is for use in a four-wheeled motor vehicle and comprises a body mounted in the instrument panel and two pairs of right and left speakers mounted in front and rear positions within the passenger compartment of the vehicle.

Figure 1:
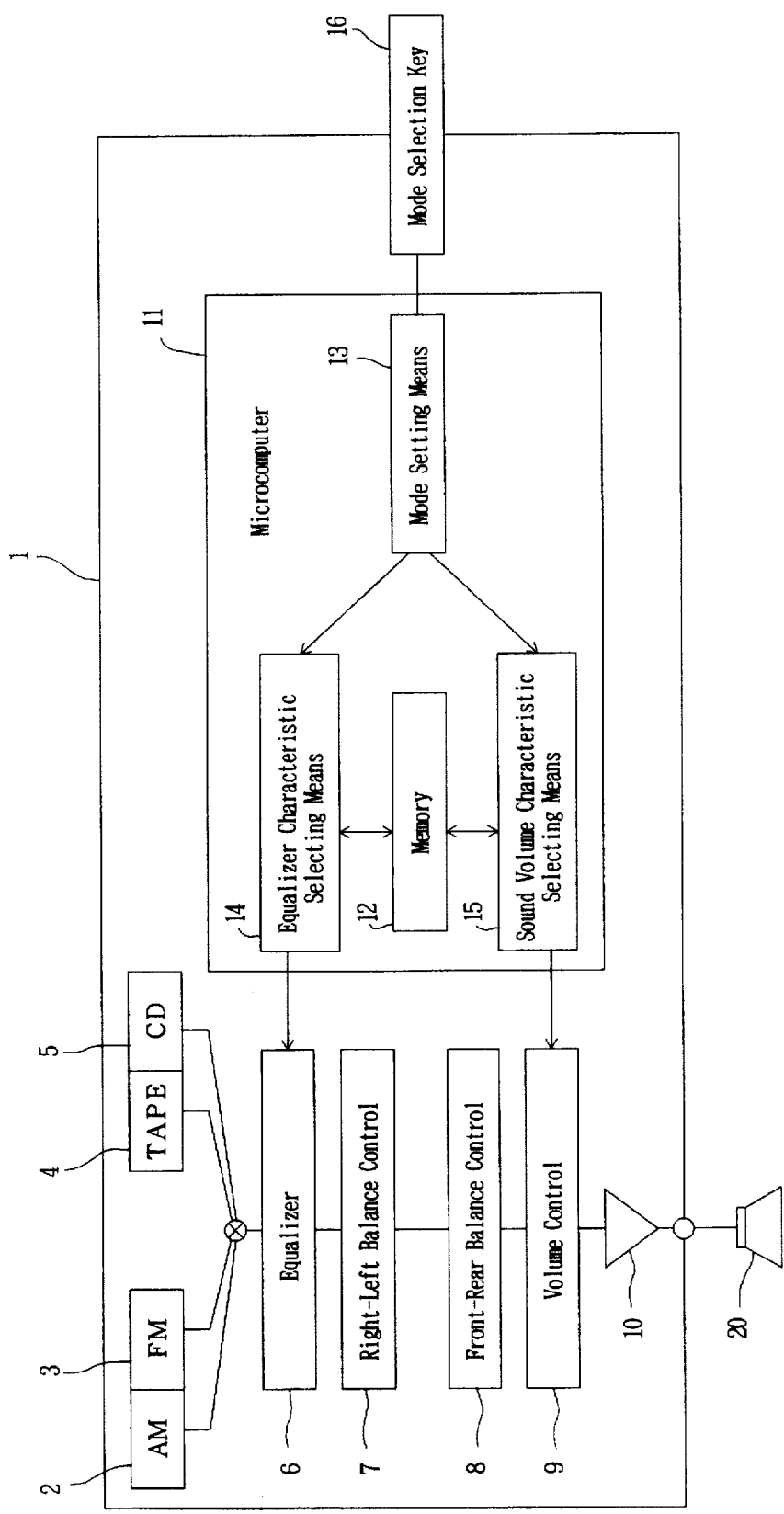
FIG. 1 is a schematic block diagram of a control system in an audio playback system for use in a vehicle according to an embodiment of the present invention.

FIG. 1 is a block diagram of the audio playback system 1 for use in a vehicle.

As audio devices there are included an AM receiver 2, an FM receiver 3, a cassette tape deck 4 and a CD player 5. An audio signal output from any of the audio devices is input to an equalizer 6 for adjustment of its frequency characteristic, then balanced between right and left sounds in a right-left balance control 7, further balanced between front and rear sounds in a front-rear balance control 8, then its sound volume is adjusted in a volume control 9, amplified by a power amplifier 10, and the amplified audio signal is output to the speakers 20.

Playback control is performed by means of a microcomputer 11, which fulfills such functions as illustrated as a block diagram in FIG. 1.

In a memory 12 of the microcomputer 11 are stored optimum equalizer characteristics and sound volume characteristics beforehand for a plurality of music genres, respectively.

In the audio playback system 1 for use in a vehicle, music genres are classified into three genres which are classical, rock and jazz (including popular), and there are set a total of four modes which are the modes corresponding to those three genres plus a flat mode (suitable for BGM for example). Equalizer characteristics and sound volume characteristics best suited to those four modes respectively are stored in the memory 12.

A mode selection key 16 is provided as one of operation keys of the audio playback system 1 which permits selection of a desired mode, and a selection signal from the mode selection key 16 is fed to the microcomputer 11, in which the selected mode is set by a mode setting means 13.

Then, on the basis of the mode set by the mode setting means 13, an equalizer characteristic selecting means 14 selects from the memory 12 an equalizer characteristic corresponding to the set mode and controls the equalizer 6 in accordance with the selected equalizer characteristic to reproduce a sound having a frequency characteristic suitable for the set mode.

At the same time, on the basis of the set mode, a sound volume characteristic selecting means 15 selects from the memory 12 a sound volume characteristic corresponding to the set mode and controls the volume control 9 in accordance with the selected sound volume characteristic, whereby a sound can be reproduced at a volume output the same as that prior to the change of mode setting.

Figure 2:
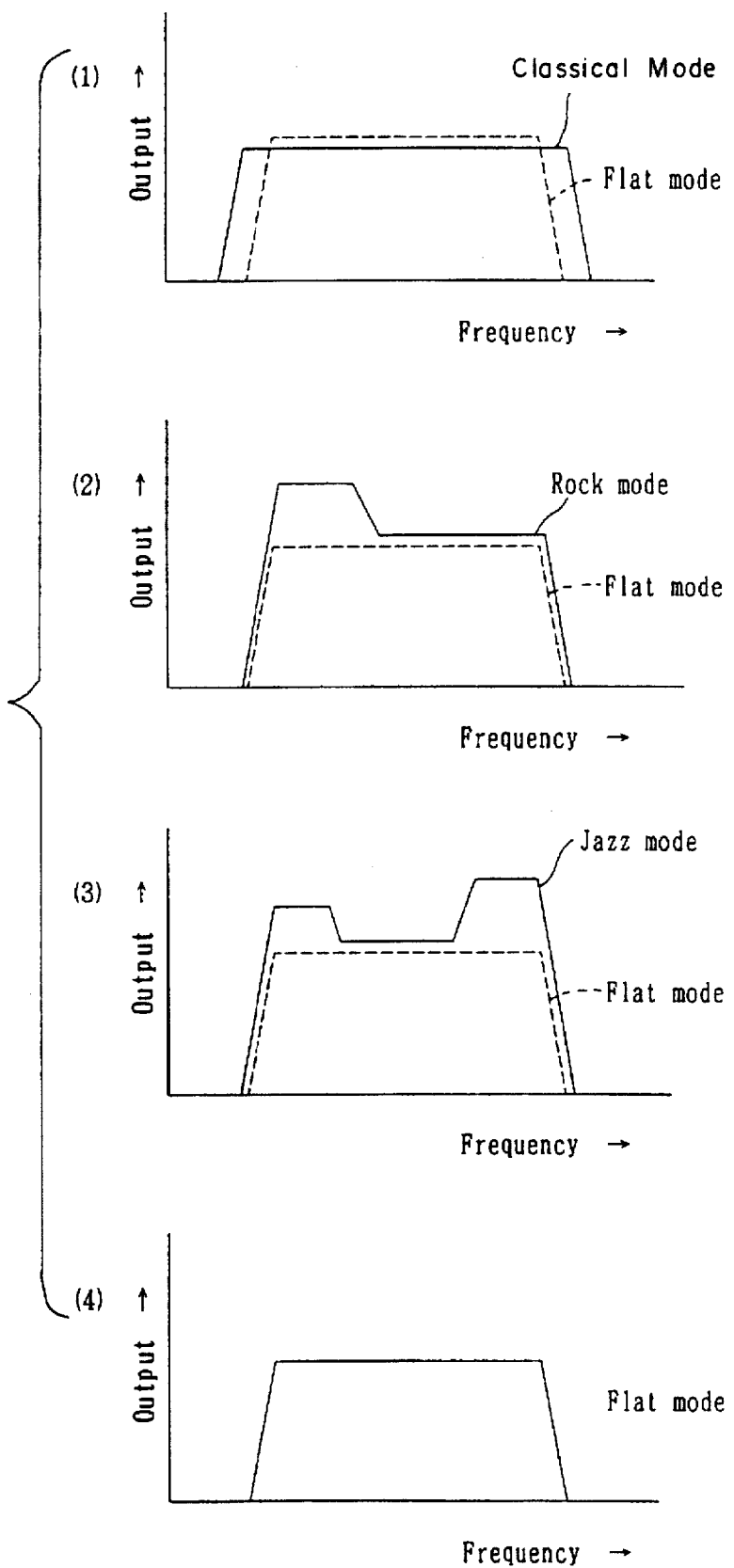
FIG. 2 is a diagram showing four kinds of equalizer characteristics for different modes in the embodiment.

FIG. 2 shows four types of equalizer characteristics classified by modes and stored in the memory 12 in this embodiment.

The equalizer characteristic in the flat mode ((4) in FIG. 2) is a correction-free characteristic which provides a flat and constant output over a predetermined frequency range.

According to the equalizer characteristic in the classical mode ((1) in FIG. 2), both low and high frequency ranges are fully expanded in comparison with that in the flat mode, and a flat characteristic is exhibited over the whole expanded range at a somewhat lower output.

The equalizer characteristic in the rock mode ((2) in FIG. 2) provides an output which is high in the low frequency range in comparison with the flat mode.

According to the equalizer characteristic in the jazz mode ((3) in FIG. 2), higher outputs are exhibited in both low and high frequency ranges as compared with the flat mode, but the output in the low frequency range is less than that in the rock mode.

By selecting one of the four equalizer characteristics on the basis of a set mode and controlling the equalizer 6 in accordance with the selected equalizer characteristic, a sound making the most of various musical instruments each individually can be reproduced while ensuring wide frequency range in the classic mode, a punchy sound with emphasis put on the lower frequency range can be reproduced in the rock mode, and a sound mainly of musical instruments can be reproduced in the jazz mode.

Figure 3:
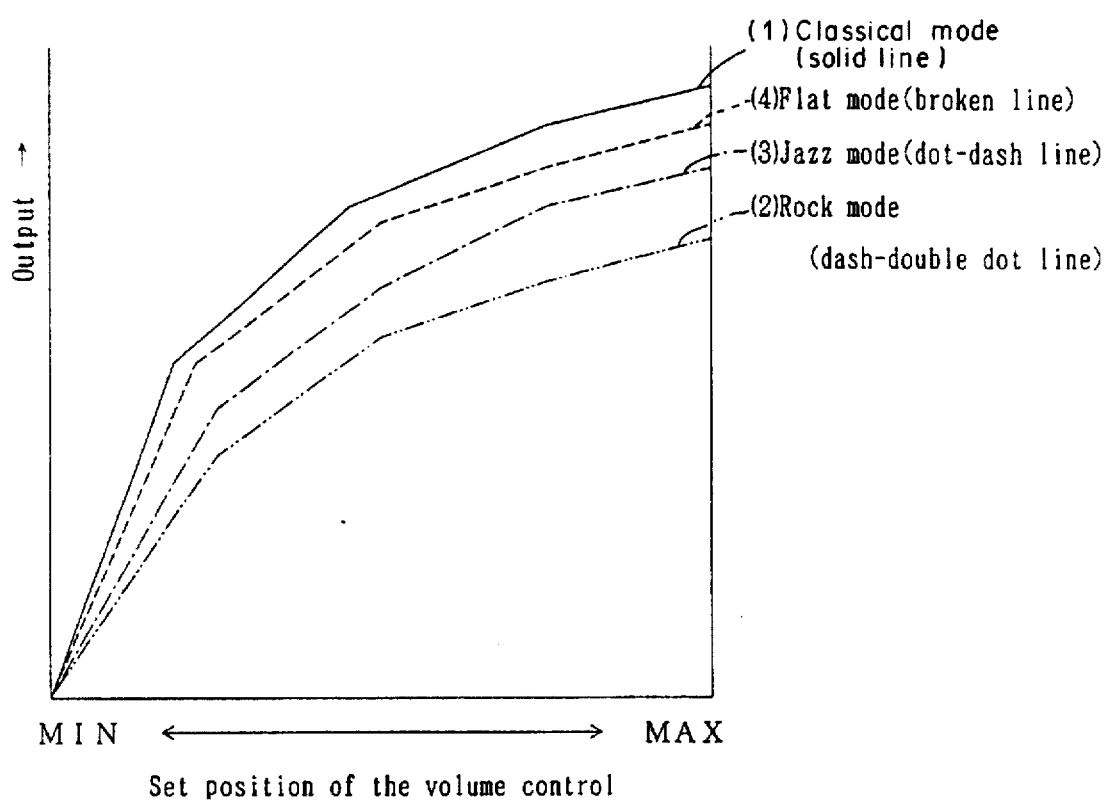
FIG. 3 is a diagram showing four kinds of sound volume characteristics for different modes in the embodiment.

On the other hand, FIG. 3 shows four types of sound volume characteristics classified by modes and stored in the memory 12 in this embodiment.

In FIG. 3, the axis of abscissa represents a set position of the volume control which is to be used for the listener to adjust the sound volume, while the axis of ordinate represents an output.

Heretofore, a sound volume characteristic has usually been limited to the characteristic in the flat mode shown in FIG. 3 irrespective of music genre, so if the volume control is adjusted and set to a volume suitable for hearing classical music in the passenger compartment of a vehicle, for example, the driver's intention of hearing a rock music in this state causes the necessity of re-adjusting the volume control because of a too large a sound volume, and thus it has been necessary to adjust the volume control at every change to a desired music genre.

As a result of experiments it has been proved that the energy of sound becomes greater in the increasing order of classical, flat, jazz and rock.

In this embodiment, therefore, sound volume characteristics are preset so that the classical mode (solid line (1)) has an output characteristic higher than that of the flat mode (broken line (4)), the jazz mode (dot-dash line (3)) has an output characteristic lower than that of the flat mode (broken line (4)), and the rock mode (dash-double dot line (2)) has an output characteristic lower than that of the jazz mode (dot-dash line (3)), as shown in FIG. 3, and the sound volume characteristics thus preset are stored in the memory 12.

One of the four types of sound volume characteristics is selected on the basis of a set mode and the volume control 9 is controlled in accordance with the selected sound volume characteristic, whereby, after the volume control has been adjusted once manually, the sound pressure of music reproduced in the passenger compartment of the vehicle can automatically be maintained constant irrespective of music genre.

Therefore, all that is to required of the listener is merely operating the mode selection key 16 at every change of music genre, with no necessity of adjusting the volume control. By operate the key 16 the sound volume is adjusted automatically to the same level as that before the mode change and sound reproduction can be done at that level.

Reference will now be made to FIG. 4, which is a flowchart showing a control procedure using microcomputer 11.

First in step 1 there is made judgment as to whether the mode selection key 16 has been turned ON or not, and if the key 16 has been turned ON and a change a from one mode to another, the flow advances to step 2 for setting to the new mode, while if the key 16 has not been turned ON, the flow skips over step 2 and advances to step 3 to maintain the present mode.

In step 3 there is made a judgment as to whether or not the mode is the classical mode, and if the answer is affirmative, the flow shifts to step 6 to select both equalizer characteristic (1) and sound volume characteristic (1) corresponding to the classical mode.

If the mode judged in step 3 is not the classical mode, the flow advances to step 4 and judgment is made as to whether or not the mode is the rock mode. If the answer is affirmative, the flow shifts to step 7 to select both equalizer characteristic (2) and sound volume characteristic (2) corresponding to the rock mode.

If the mode judged in step 4 is not the rock mode, the flow advances to step 5 and judgment is made as to whether or not the mode is the jazz mode. If the answer is affirmative, the flow shifts to step 8 to select both equalizer characteristic (3) and sound volume characteristic (3) corresponding to the jazz mode.

If the mode judged in step 5 is not the jazz mode, it follows that the mode is the flat mode, and the flow advances to step 9 to select both equalizer characteristic (4) and sound volume characteristic (4) corresponding to the flat mode.

Sound reproduction is performed under the equalizer characteristic and sound volume characteristic which have thus been selected through any of steps 6, 7, 8 and 9. (Step 10)

Since control is made in the above manner, when the listener wants to hear a music piece different in genre from the previous one, the listener is merely required to operate the mode selection key 16 to select a desired mode, whereby it is made possible to hear a reproduced sound at the frequency characteristic suitable for the selected mode and at the same sound volume as that in the previous mode.

Thus, the driver is released from the necessity of adjusting the sound volume at every change of music genre and can devote himself to driving.

According to the present invention, as set forth above, once a desired mode is set out of the modes classified by music genre, both equalizer characteristic and sound volume characteristic suitable for the set mode are selected from among a plurality of pre-stored equalizer characteristics and sound volume characteristics, and sound reproduction is performed in accordance with the selected characteristics, so not only the frequency characteristic but also the sound volume is adjusted automatically to a constant level irrespective of mode, that is, there is no need of making the troublesome volume adjustment for each music genre. This is convenient.

Particularly in the case where the audio playback system of the invention is mounted on a vehicle, the vehicle driver is no longer troubled by the volume adjusting operation. This is very convenient.

What is claimed is:

1. An audio playback system including:

a memory means which stores a set of equalizer characteristics and a set of sound volume characteristics each optimum for a plurality of music genres respectively;

a mode selecting means for selecting a mode for each of said plurality of music genres by operation from an exterior;

a mode setting means for setting the mode in response to said mode selecting means;

an equalizer characteristic setting means for automatically selecting a corresponding optimum equalizer characteristic from said memory means on the basis of the mode set by said mode setting means and setting said equalizer according to said selected equalizer characteristic;

a sound volume characteristic setting means for automatically selecting a corresponding optimum sound volume characteristic from said memory means on the basis of the mode set by said mode setting means and setting said volume control according to said selected sound volume characteristic;

wherein a sound is reproduced in accordance with the equalizer characteristic automatically set by said equalizer characteristic setting means and the sound volume characteristic automatically set by said sound volume characteristic setting means.

2. An audio playback system according to claim 1, which is for use in a vehicle and which comprises speakers mounted in the passenger compartment of the vehicle and a body portion mounted in the instrument panel of the vehicle.

3. An audio playback system according to claim 1, wherein playback control is performed by means of a microcomputer, and said optimum equalizer characteristics and sound volume characteristics are stored in said microcomputer.

4. An audio playback system according to claim 1, wherein said mode selecting means comprises a mode selection key.

5. An audio playback system including:

a memory means which stores a set of equalizer characteristics and a set of sound volume characteristics each optimum for a plurality of music genres respectively;

a mode selecting means for selecting a mode for each of said plurality of music genres by operation from an exterior;

a mode setting means for setting the mode in response to said mode selecting means;

an equalizer characteristic setting means for selecting a corresponding optimum equalizer characteristic from said memory means on the basis of the mode set by said mode setting means and setting said equalizer according to said selected equalizer characteristic; and a sound volume characteristic setting means for selecting a corresponding optimum sound volume characteristic from said memory means on the basis of the mode set by said mode setting means and setting said volume control according to said selected sound volume characteristic, wherein a sound is reproduced in accordance with the equalizer characteristic set by said equalizer characteristic setting means and the sound volume characteristic set by said sound volume characteristic setting means, and wherein when an equalizer characteristic enhanced in a low frequency range or a high frequency range as compared with an equalizer characteristic in a flat mode is selected, a sound volume characteristic set lower as compared with a sound volume characteristic in the flat mode is selected.

6. An audio playback system including:

a memory means which stores a set of equalizer characteristics and a set of sound volume characteristics each optimum for a plurality of music genres respectively:

a mode selecting means for selecting a mode for each of said plurality of music genres by operation from an exterior;

a mode setting means for setting the mode in response to said mode selecting means;

an equalizer characteristic setting means for selecting a corresponding optimum equalizer characteristic from said memory means on the basis of the mode set by said mode setting means and setting said equalizer according to said selected equalizer characteristic; and a sound volume characteristic setting means for selecting a corresponding optimum sound volume characteristic from said memory means on the basis of the mode set by said mode setting means and setting said volume control according to said selected sound volume characteristic, wherein a sound is reproduced in accordance with the equalizer characteristic set by said equalizer characteristic setting means and the sound volume characteristic set by said sound volume characteristic setting means, wherein when an equalizer characteristic having a wider frequency range than that in a flat mode is selected, a sound volume characteristic set higher as compared with a sound volume characteristic in the flat mode is selected.

* * * * *